(12) United States Patent
Lo et al.

(10) Patent No.: US 7,682,756 B2
(45) Date of Patent: Mar. 23, 2010

(54) ANTI-ABERRATION PATTERN AND METHOD FOR MANUFACTURING THE SAME

(75) Inventors: Chao-Lung Lo, Hsinchu (TW); Tzong-Hsien Wu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 1008 days.

(21) Appl. No.: 11/326,827

(22) Filed: Jan. 6, 2006

(65) Prior Publication Data

US 2007/0160914 A1 Jul. 12, 2007

(51) Int. Cl.
*G03F 1/00* (2006.01)

(52) U.S. Cl. .............................. 430/5; 716/19

(58) Field of Classification Search ................ 430/5, 430/22, 311; 716/19
See application file for complete search history.

(56) References Cited

U.S. PATENT DOCUMENTS

| | | | | |
|---|---|---|---|---|
| 6,074,787 A * | 6/2000 | Takeuchi | ................. | 430/5 |
| 6,472,108 B1 * | 10/2002 | Lin | ................. | 430/5 |
| 6,818,480 B2 * | 11/2004 | Lee et al. | ................. | 438/128 |
| 2004/0018434 A1 * | 1/2004 | Tamada | ................. | 430/5 |
| 2004/0219435 A1 * | 11/2004 | Wu et al. | ................. | 430/5 |
| 2005/0003305 A1 * | 1/2005 | Hashimoto et al. | ................. | 430/311 |
| 2005/0202321 A1 * | 9/2005 | Gordon et al. | ................. | 430/5 |
| 2007/0035031 A1 * | 2/2007 | Jessen et al. | ................. | 257/774 |

* cited by examiner

*Primary Examiner*—Mark F Huff
*Assistant Examiner*—Stewart A Fraser
(74) *Attorney, Agent, or Firm*—J.C. Patents

(57) ABSTRACT

The invention is directed to a pattern on a mask. The pattern comprises a main dense pattern, a first anti-aberration pattern and a second anti-aberration pattern. The main dense pattern comprises a first outmost sub-pattern and a second outmost sub-pattern, wherein the first outmost sub-pattern and the second pattern are not adjacent to each other. The first anti-aberration pattern is located adjacent to the first outmost sub-pattern with a first distance. The second anti-aberration pattern is located adjacent to the second outmost sub-pattern with a second distance, wherein the first distance and the second distance are different from each other.

13 Claims, 3 Drawing Sheets

ANTI-ABERRATION PATTERN AND METHOD FOR MANUFACTURING THE SAME

BACKGROUND OF THE INVENTION

1. Field of Invention

The present invention relates to a pattern on a mask and a method for forming the same. More particularly, the present invention relates to an anti-aberration pattern on a mask and a method for forming the same.

2. Description of Related Art

In the manufacture of integrated circuit, photolithography process is used to transfer patterns from a photo mask having customized circuit patterns to thin films formed on a wafer. The image transfer process comprises steps of forming a photoresist layer on a non-process layer, illuminating the photoresist layer through a photo mask having the customized circuit patterns, developing the photoresist layer and then etching the non-process layer by using the patterned photoresist layer as a mask. Hence, the image transfer process is accomplished.

However, the critical dimension of the pattern in the photoresist layer is affected by several factors including the exposure dosage, thickness of the photoresist layer and the variables in the development process. With the decrease of the size of the device, the line width of the device is getting smaller and smaller. Therefore, a small amount difference in the critical dimension of the device will lead to dramatic changes in electrical performance of the device. However, as the critical dimension of the device is decreased, the aberration caused by the photo tools strongly affects the appearance of the critical dimension of the dense pattern, especially the edge features of the dense pattern.

Currently, the way to alleviate the unbalanced developed critical dimensions of the edge features of the dense pattern is to sacrifice the performance of the photo tool to compensate the critical dimension difference. Nevertheless, as the critical dimension of the device is decreased, sacrificing the performance of the photo tools is not enough for balancing the developed critical dimension differences at the edge features of the dense pattern. Instead, the relatively poor photo tool performance ruin the reliability of the device.

SUMMARY OF THE INVENTION

Accordingly, at least one objective of the present invention is to provide a pattern on a mask with an anti-aberration pattern located adjacent thereto. Therefore, the problem of unbalanced developed critical dimensions of the edge features of the dense pattern transferred from the mask can be solved.

At least another objective of the present invention is to provide a method for forming an anti-aberration pattern on a mask capable of eliminating the aberration influence caused by the photo tools and well controlling the developed critical dimension of the edge features of the dense patterns transferred from the mask.

To achieve these and other advantages and in accordance with the purpose of the invention, as embodied and broadly described herein, the invention provides a pattern on a mask. The pattern comprises a main dense pattern, a first anti-aberration pattern and a second anti-aberration pattern. The main dense pattern comprises a first outmost sub-pattern and a second outmost sub-pattern, wherein the first outmost sub-pattern and the second pattern are not adjacent to each other. The first anti-aberration pattern is located adjacent to the first outmost sub-pattern with a first distance. The second anti-aberration pattern is located adjacent to the second outmost sub-pattern with a second distance, wherein the first distance and the second distance are different from each other.

According to one embodiment of the present invention, the aforementioned main dense pattern is a line-space pattern.

According to one embodiment of the present invention, the width of the aforementioned first outmost sub-pattern is as same as that of the aforementioned second outmost sub-pattern.

The present invention also provides an anti-aberration pattern for eliminating an aberration effect on a first dense pattern and a second dense pattern on the mask, wherein the first dense pattern and the second dense pattern are adjacent to each other. The anti-aberration pattern comprises a first sub-pattern and a second sub-pattern. The first sub-pattern is located between the first dense pattern and the second dense pattern, wherein the first sub-pattern is adjacent to the first dense pattern with a first distance. The second sub-pattern is located between the first sub-pattern and the second dense pattern, wherein the second sub-pattern is adjacent to the second dense pattern with a second distance and the first distance is different from the second distance.

According to one embodiment of the present invention, the aforementioned first dense pattern and the second dense pattern are line-space patterns.

According to one embodiment of the present invention, the critical dimension of the aforementioned first dense pattern is equal to that of the aforementioned second dense pattern.

According to one embodiment of the present invention, the aforementioned first dense pattern has a first outmost edge feature, the aforementioned second dense pattern has a second outmost edge feature close to the first outmost edge feature and the width of the first outmost edge feature is equal to that of the second outmost edge feature.

The present invention also provides a method for eliminating an aberration influence on a dense pattern of a mask, wherein the dense pattern comprises at least two edge features including a first edge feature and a second edge feature and the width of the first edge feature is equal to that of the second edge feature. The method comprises steps of determining a developed critical dimension of the dense pattern and then forming an anti-aberration pattern comprising a first sub-pattern and a second sub-pattern on the mask, wherein the first sub-pattern is located adjacent to the first edge feature with a first distance, the second sub-pattern is located adjacent to the second edge feature with a second distance and the first distance and the second distance are different.

According to one embodiment of the present invention, after the step of determining the developed critical dimension, it comprises a step of retrieving the first distance and the second distance from a database according to the developed critical dimension with respect to the dense pattern, wherein the first distance relates to the first edge feature and the second distance relates to the second edge feature.

According to one embodiment of the present invention, the aforementioned database comprises a plurality of records with respect to relationships between the developed critical dimensions of the edge features and the distance between the edge patterns and the anti-aberration pattern.

According to one embodiment of the present invention, the width of the aforementioned first edge feature is equal to that of the aforementioned second edge feature.

According to one embodiment of the present invention, the aforementioned dense pattern is a line-space pattern.

In the present invention, since the anti-aberration pattern is formed adjacent to the main dense pattern with a predetermined distance on a mask, the aberration effect caused by the photo tools can be eliminated by the interference induced by the anti-aberration pattern. Therefore, the problem of the unbalanced developed critical dimension of the edge features of the main dense pattern can be solved. Furthermore, by forming the anti-aberration pattern between two main dense patterns on a mask, the unbalanced developed critical dimension of the edge features of the two main dense patterns which is induced by the tool aberration. Therefore, the development result of the dense pattern on the mask is free from the aberration effects and it is unnecessary to scarify the tool performance to compensate the aberration effect.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
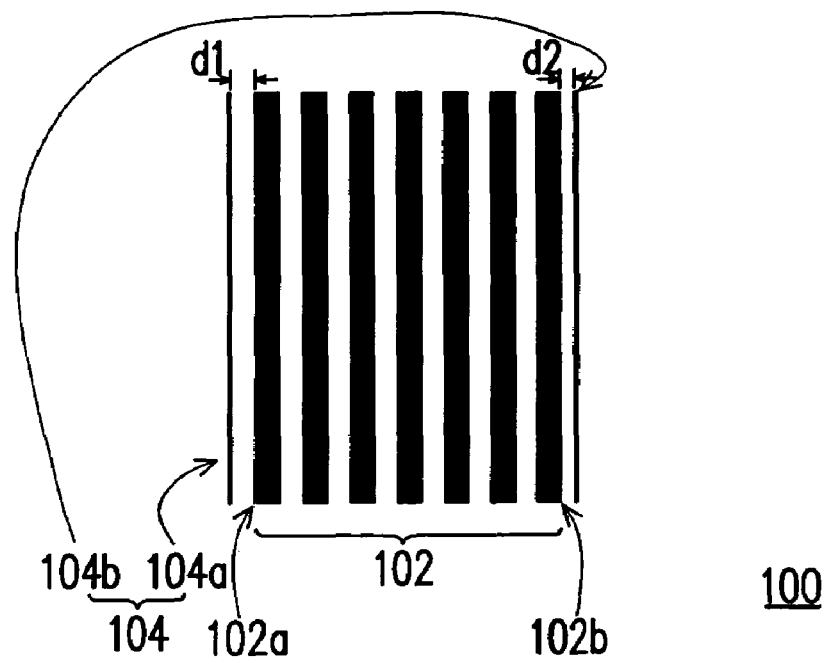
FIG. 1 is a schematic drawing showing a pattern on a mask according to a preferred embodiment of the invention.

FIG. 1 is a schematic drawing showing a pattern on a mask according to a preferred embodiment of the invention. As shown in FIG. 1, on a mask 100, there are a dense pattern 102 and an anti-aberration pattern 104. The dense pattern 102 can be, for example but not limited to, a line-space pattern. The dense pattern 102 comprises at least two sub-patterns. More specifically, the dense pattern 102 has an outmost sub-pattern 102a and an outmost sub-pattern 102b at the edges of the dense pattern 102 respectively. The width of the outmost sub-pattern 102a is equal to that of the outmost sub-pattern 102b.

Due to the tool aberration influence, the edge patterns transformed from the mask onto the photoresist layer possess different developed critical dimensions. In order to eliminate the aberration influence, the anti-aberration pattern 104 is located adjacent to the dense pattern 102. The anti-aberration pattern 104 comprises a sub-pattern 104a and a sub-pattern 104b. The sub-pattern 104a is close to the outmost sub-pattern 102a with a distance d1. Moreover, the sub-pattern 104b is adjacent to the outmost sub-pattern 102b with a distance d2. The distance d1 is different from the distance d2. Accordingly, by properly adjusting the distance d1 and the distance d2 and the physical properties of the sub-pattern 102a and the sub-pattern 102b, the edge sub-pattern transferred from the mask is the same. Notably, the physical properties of the sub-pattern 102a and the sub-pattern 102b include the width of the sub-pattern 102a and the sub-pattern 102b and the transmission rate of the sub-pattern 102a and the sub-pattern 102b.

Because of the anti-aberration pattern 104, the aberration influence can be compensated by the inference induced by the anti-aberration pattern. Therefore, the developed critical dimensions of the edge sub-patterns of the dense pattern transferred from the mask can be balanced.

Figure 2:
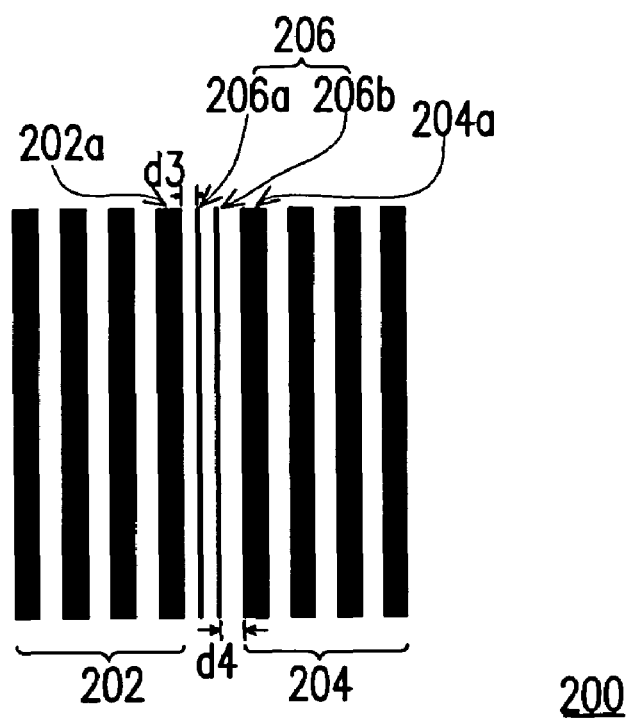
FIG. 2 is a schematic drawing showing two dense patterns on a mask according to a preferred embodiment of the invention.

FIG. 2 is a schematic drawing showing two dense patterns on a mask according to another preferred embodiment of the invention. As shown in FIG. 2, there are a dense pattern 202 and a dense pattern 204 on a mask 200, wherein the dense pattern 202 is close to the dense pattern 204. The dense patterns 202 and 204 can be, for example but not limited to, line-space patterns. Moreover, at the edge of the dense pattern 202 close to the dense pattern 204, the dense pattern 202 possesses an edge feature 202a. Similarly, the dense pattern 204 possesses an edge feature 204a at the edge of the dense pattern 204 near the dense pattern 202. It should be noticed that the width of the edge feature 202a is equal to that of the edge feature 204a. Between the dense pattern 202 and the dense pattern 204, there is an anti-aberration pattern 206. The anti-aberration pattern 206 comprises a sub-pattern 206a and a sub-pattern 206b. The sub-pattern 206a is adjacent to the edge feature 202a of the dense pattern 202. Furthermore, the sub-pattern 206b is located between the sub-pattern 206a and the dense pattern 204. The sub-pattern 206a is apart from the edge feature 202a with a distance d3 and the sub-pattern 206b is apart from the edge feature 204a with a distance d4. It should be noticed that the distance d3 is different from the distance d4.

Since the width of the edge feature 202a is as same as that of the edge feature 204a, the edge patterns in the photoresist layer transferred from the edge features 202a and the 204a should possess the same width. However, because of the aberration influence of the photo tools, the width of the edge pattern in the photoresist layer transferred from the edge feature 202a on the mask 200 is different from that of the edge pattern in the photoresist layer transferred from the edge feature 204a on the mask 200. By placing the anti-aberration pattern 206 between the dense patterns 202 and 204 and further adjusting the distance d3 and the distance d4 and the physical properties of the anti-aberration pattern 206, the aberration influence can be eliminated by the inference induced by the anti-aberration pattern 206. Hence, the problem of the unbalanced developed critical dimensions between the edge features of the dense patterns can be solved.

Figure 3:
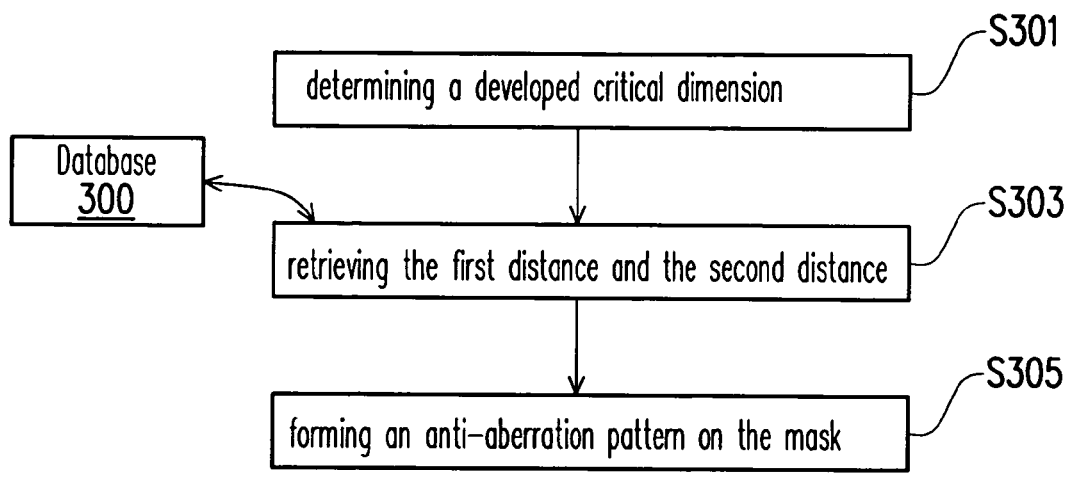
FIG. 3 is a flow chart showing a method for eliminating an aberration influence according to a preferred embodiment of the invention.
Figure 4:
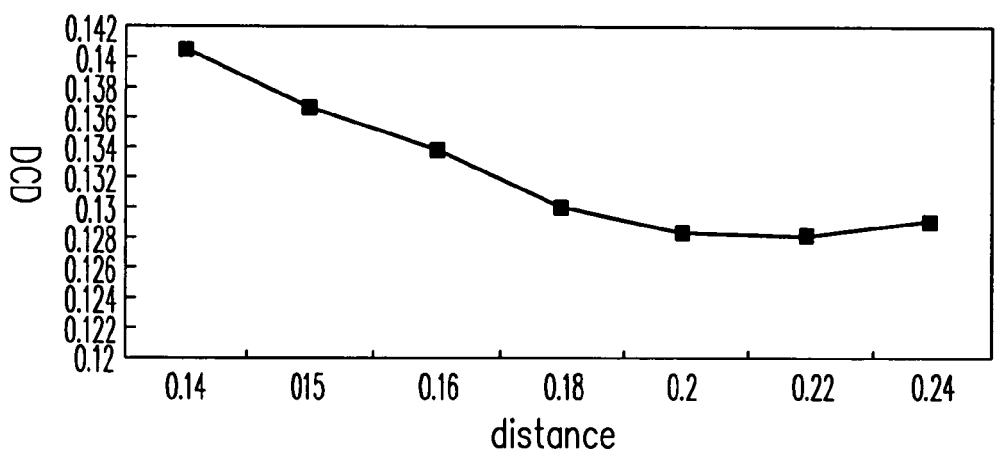
FIG. 4 is a developed critical dimension-distance plot diagram.
Figure 5:
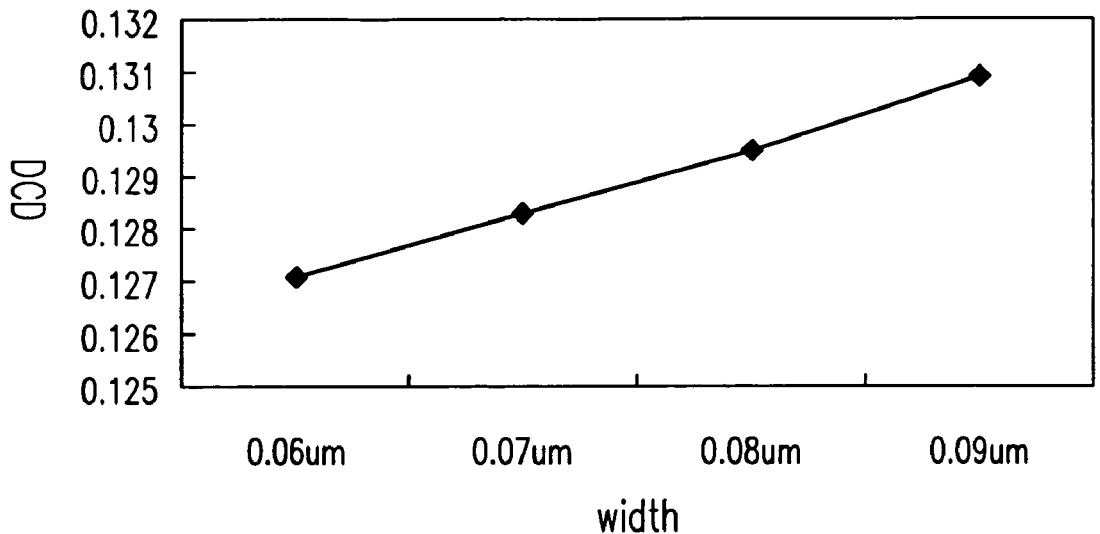
FIG. 5 is a developed critical dimension-width plot diagram.
Figure 6:
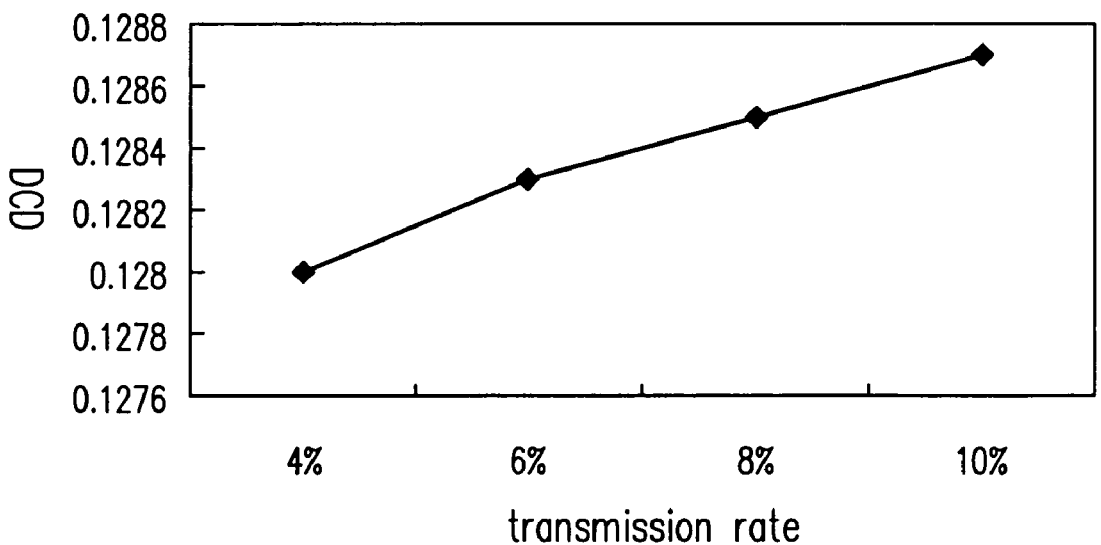
FIG. 6 is a developed critical dimension-transmission rate plot diagram.

FIG. 3 is a flow chart showing a method for eliminating an aberration influence according to a preferred embodiment of the invention. FIG. 4 is a developed critical dimension-distance plot diagram. FIG. 5 is a developed critical dimension-width plot diagram. FIG. 6 is a developed critical dimension-transmission rate plot diagram. As shown in FIG. 3, in the step S301, a developed critical dimension of a dense pattern on the mask is determined. In the step S303, according to the developed critical dimension, a first distance and a second distance are retrieved from a database 300. In the database 300, there are several records with respect to the relationship between the developed critical dimension of the edge features/outmost sub-patterns of the main dense pattern and the distance between the anti-aberration pattern and the edge feature/outmost sub-pattern. The database further comprises the records with respect to the relationship between the developed critical dimension of the edge features/outmost sub-patterns of the main dense pattern and the physical-properties of the anti-aberration patterns. For one of the edge feature/outmost sub-pattern of the main dense pattern, the plot curve shown in FIG. 4 shows the relationship between the developed critical dimension of the edge feature and the distance between the anti-aberration pattern and the edge feature/outmost sub-pattern of the dense pattern. Also, for the same one of the edge feature/outmost sub-pattern of the main dense pattern, the plot curve shown in FIG. 5 presents the relationships between the developed critical dimension of the edge feature and the width of the closest anti-aberration pattern. Furthermore, for the same one of the edge feature/outmost sub-pattern of the main dense pattern, the plot curve shown in FIG. 6 presents the relationships between the developed critical dimension of the edge feature and the transmission rate of the closest anti-aberration pattern. That is, according to the developed critical dimension determined in the step S301, a proper distance between the anti-aberration pattern and one of the edge features/outmost sub-patterns of the main dense pattern can be obtained by referring to the records in the database 300. Meanwhile, the proper physical properties including the transmission rate and the width of the anti-aberration pattern are also obtained by referring to the records in the database 300 according to the developed critical dimension determined in the step S301. It should be noticed that the aberration influence of each edge feature is eliminated by placing an anti-aberration pattern close to the edge feature. The result of the elimination of the aberration influence on one edge feature of the dense pattern depends on variables, such as distance between the edge feature and the closest anti-aberration pattern and the width and the transmission rate of the closest anti-aberration pattern. It should be noticed that the transmission rates of the anti-aberration pattern are not always to be equal to each other. The transmission rate of the anti-aberration pattern is varied with the developed critical dimension of the closest edge feature of the main dense pattern. Similar to the transmission rate, the widths of the anti-aberration pattern are not always to be equal to each other. That is, the width of each anti-aberration pattern is varied with the developed critical dimension of the closest edge feature of the main dense pattern.

It should be noticed that the anti-aberration pattern on the mask is disposed close to each of the outmost sub-patterns of the dense pattern on the mask. That is, for each outmost sub-pattern of the dense pattern on the mask, there is a sub-pattern of the anti-aberration pattern disposed aside the dense pattern. Therefore, the developed critical dimensions of the outmost sub-patterns of the dense pattern transferred from the mask onto the wafer can be balanced. Even for at least two dense patterns being disposed near each other, the sub-patterns of the anti-aberration pattern are disposed between the dense patterns on the mask so as to balance the developed critical dimensions of the edge sub-patterns of the both dense patterns on the wafer with each other, wherein the dense patterns on the wafer are transferred from the mask. In the aforementioned embodiment of the present invention, only one sub-pattern of the anti-aberration pattern is disposed aside one outmost sub-pattern of the dense pattern. However, the invention is not limited to by disposing only one sub-pattern of the anti-aberration pattern as described above. As long as the aberration effect can be eliminated, the number of the sub-patterns of the aberration pattern aside each outmost sub-pattern of the dense pattern can be varied.

In the present invention, since the anti-aberration pattern is formed adjacent to the main dense pattern with a predetermined distance on a mask, the aberration effect caused by the photo tools can be eliminated by the interference induced by the anti-aberration pattern. Therefore, the problem of the unbalanced developed critical dimension of the edge features of the main dense pattern can be solved. Also, the width of each edge features of the main dense pattern transferred from the mask can be well controlled to be equal to each other by adjusting the distance between the sub-patterns of the anti-aberration pattern and the edge features of the main dense pattern on the mask. Furthermore, by forming the anti-aberration pattern between two main dense patterns on a mask, the unbalanced developed critical dimension of the edge features of the two main dense patterns which is induced by the tool aberration. Therefore, the development result of the dense pattern on the mask is free from the aberration effects and it is unnecessary to sacrifice the tool performance to compensate the aberration effect.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A pattern on a mask, comprising:
   a main dense pattern comprising a first outmost sub-pattern and a second outmost sub-pattern, wherein the main dense pattern is a line-space pattern and the first outmost sub-pattern and the second outmost sub-pattern are not adjacent to each other;
   a single first anti-aberration pattern located adjacent to the first outmost sub-pattern with a first distance; and
   a single second anti-aberration pattern located adjacent to the second outmost sub-pattern with a second distance, wherein the first distance and the second distance are different from each other.

2. The pattern of claim 1, wherein the width of the first outmost sub-pattern is as same as that of the second outmost sub-pattern.

3. An anti-aberration pattern for eliminating an aberration effect on a first dense pattern and a second dense pattern, wherein the first dense pattern and the second dense pattern are line-space patterns adjacent to each other, the anti-aberration pattern comprising:
   a first sub-pattern located between the first dense pattern and the second dense pattern, wherein the first sub-pattern is adjacent to the first dense pattern with a first distance; and
   a second sub-pattern located between the first sub-pattern and the second dense pattern, wherein the second sub-pattern is adjacent to the second dense pattern with a second distance and the first distance is different from the second distance.

4. The anti-aberration pattern of claim 3, wherein the critical dimension of the first dense pattern is equal to that of the second dense pattern.

5. The anti-aberration pattern of claim 3, wherein the first dense pattern has a first outmost edge feature, the second dense pattern has a second outmost edge feature close to the first outmost edge feature and the width of the first outmost edge feature is equal to that of the second outmost edge feature.

6. A method for eliminating an aberration influence on a dense pattern of a mask, wherein the dense pattern comprises at least two edge features including a first edge feature and a second edge feature and the width of the first edge feature is equal to that of the second edge feature, the method comprising:

determining a developed critical dimension of the dense pattern, wherein the dense pattern is a line-space pattern; and forming an anti-aberration pattern comprising a first sub-pattern and a second sub-pattern on the mask, wherein the first sub-pattern is located adjacent to the first edge feature with a first distance, the second sub-pattern is located adjacent to the second edge feature with a second distance and the first distance and the second distance are different.

7. The method of claim 6, after the step of determining the developed critical dimension, further comprising a step of retrieving the first distance and the second distance from a database according to the developed critical dimension with respect to the dense pattern, wherein the first distance relates to the first edge feature and the second distance relates to the second edge feature.

8. The method of claim 7, wherein the database comprises a plurality of records with respect to relationships between the developed critical dimensions of the edge features and the distance between the edge patterns and the anti-aberration pattern.

9. The method of claim 7, wherein the step of retrieving the first distance and the second distance further comprises a step of retrieving a first width of the first sub-pattern and a second width of the second sub-pattern according to the developed critical dimension with respect to the dense pattern, wherein the first width relates to the first edge feature and the second width relates to the second edge feature.

10. The method of claim 9, wherein the database comprises a plurality of records with respect to the relationships between the developed critical dimensions of the edge features and the widths of sub-patterns of the anti-aberration pattern.

11. The method of claim 7, wherein the step of retrieving the first distance and the second distance further comprises a step of retrieving a first transmission rate of the first sub-pattern and a second transmission rate of the second sub-pattern according to the developed critical dimension with respect to the dense pattern, wherein the first transmission rate relates to the first edge feature and the second transmission rate relates to the second edge feature.

12. The method of claim 11, wherein the database comprises a plurality of records with respect to relationships between the developed critical dimensions of the edge features and the transmission rates of sub-patterns of the anti-aberration pattern.

13. The method of claim 6, wherein the width of the first edge feature is equal to that of the second edge feature.

* * * * *